US012641816B2

(12) United States Patent
Cheng

(10) Patent No.: US 12,641,816 B2
(45) Date of Patent: May 26, 2026

(54) SEMICONDUCTOR STRUCTURES HAVING A HETEROJUNCTION STRUCTURE WITH POLARIZED REGIONS AND NON-POLARIZED REGIONS, AND MANUFACTURING METHODS THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 579 days.

(21) Appl. No.: 17/927,606

(22) PCT Filed: Sep. 22, 2020

(86) PCT No.: PCT/CN2020/116861
§ 371 (c)(1),
(2) Date: Nov. 23, 2022

(87) PCT Pub. No.: WO2022/061525
PCT Pub. Date: Mar. 31, 2022

(65) Prior Publication Data
US 2023/0170408 A1 Jun. 1, 2023

(51) Int. Cl.
H10D 30/00 (2025.01)
H10D 30/01 (2025.01)
H10D 30/47 (2025.01)

(52) U.S. Cl.
CPC ......... H10D 30/475 (2025.01); H10D 30/015 (2025.01)

(58) Field of Classification Search
CPC .. H10D 30/471; H10D 30/015; H10D 30/472; H10D 30/475; H10D 30/478
See application file for complete search history.

(56) References Cited

U.S. PATENT DOCUMENTS 9,129,889 B2 9/2015 Padmanabhan et al.
9,502,550 B2 11/2016 Padmanabhan et al.
(Continued)

FOREIGN PATENT DOCUMENTS

CN 101252088 A 8/2008
CN 102856355 A 1/2013
(Continued)

OTHER PUBLICATIONS

ISA State Intellectual Property Office of the People's Republic of China, International Search Report Issued in Application No. PCT/CN2020/116861, Jun. 25, 2021, WIPO, 4 pages.
(Continued)

*Primary Examiner* — Reema Patel
(74) *Attorney, Agent, or Firm* — BSJ & Sun LLC

(57) ABSTRACT

Provided are a semiconductor structure and manufacturing method thereof, the semiconductor comprising: a base, wherein the base comprises strip trenches arranged parallelly; and a heterojunction structure located on bottom walls and sidewalls of the strip trenches and on the base other than the strip trenches, wherein regions of the heterojunction structure located on the bottom walls and on the base other than the strip trenches are polarized regions, regions of the heterojunction structure on the sidewalls are non-polarized regions, and the polarized regions contain carriers; the heterojunction structure comprises a source region and a drain region respectively located at both ends of each of the strip trenches, and a gate region between the source region and the drain region; and the carriers between the source region and the drain region are confined to flow in each of the polarized regions.

8 Claims, 7 Drawing Sheets

(56)                    References Cited

U.S. PATENT DOCUMENTS

| | | |
|---|---|---|
| 2014/0264369 A1 | 9/2014 | Padmanabhan et al. |
| 2015/0340482 A1 | 11/2015 | Padmanabhan et al. |
| 2019/0288101 A1 | 9/2019 | Longobardi et al. |

FOREIGN PATENT DOCUMENTS

| | | | |
|---|---|---|---|
| CN | 103681830 | A | 3/2014 |
| CN | 104051520 | A | 9/2014 |
| CN | 110299408 | A | 10/2019 |
| CN | 110392929 | A | 10/2019 |
| JP | 2009099774 | A | 5/2009 |
| TW | 201929221 | A | 7/2019 |
| WO | 2018063409 | A1 | 4/2018 |

OTHER PUBLICATIONS

ISA State Intellectual Property Office of the People's Republic of China, Written Opinion of the International Searching Authority Issued in Application No. PCT/CN2020/116861, Jun. 25, 2021, WIPO, 4 pages.(Submitted with Machine/Partial Translation).

TW Patent Office, Office Action Issued in Application No. 110134796, Aug. 22, 2022, 10 pages . . . (Submitted with Machine/Partial Translation).

State Intellectual Property Office of the People's Republic of China, Office Action and Search Report Issued in Application No. 2020801033222, Apr. 23, 2025, 12 pages. (Submitted with Machine Translation).

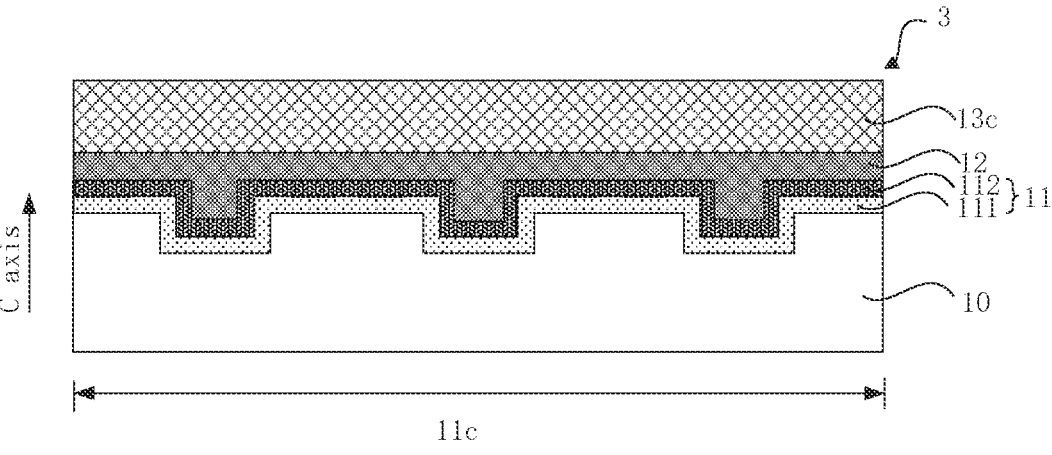
FIG. 9
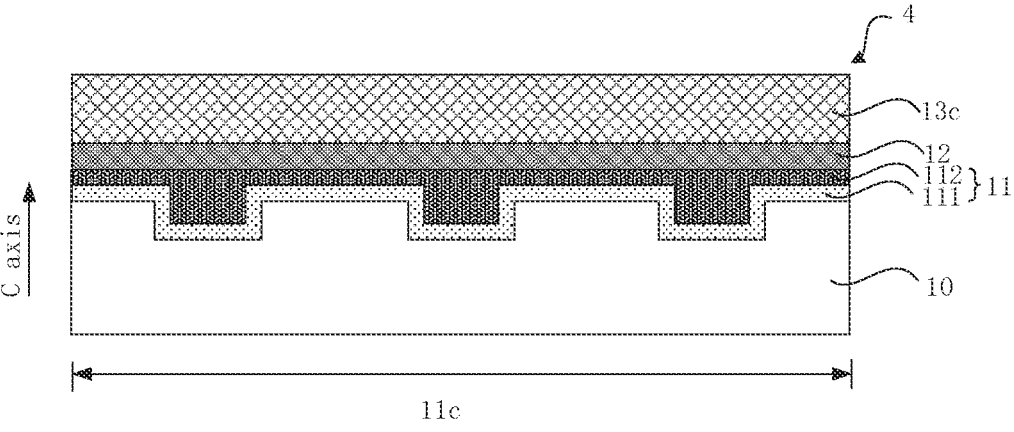
FIG. 10
FIG. 11

SEMICONDUCTOR STRUCTURES HAVING A HETEROJUNCTION STRUCTURE WITH POLARIZED REGIONS AND NON-POLARIZED REGIONS, AND MANUFACTURING METHODS THEREOF

CROSS REFERENCE TO RELATED APPLICATIONS

This application is a US National Phase of a PCT Application No. PCT/CN2020/116861 filed on Sep. 22, 2020, the entire contents of which are incorporated herein by reference in their entireties.

TECHNICAL FIELD

The present disclosure relates to the technical field of semiconductor, and in particular, to semiconductor structures and manufacturing methods thereof.

BACKGROUND

As a typical representative of the third generation of semiconductor materials, the wide band semiconductor material group III nitride has advantages of large bandgap, high pressure resistance, high temperature resistance, high electron saturation velocity, drift velocity, and easy formation of high-quality heterostructures, and is very suitable for the manufacture of high temperature, high frequency, high power electronic devices.

For example, the AlGaN/GaN heterojunction structure has a high concentration of two-dimensional electron gas (2DEG) at the AlGaN/GaN interface due to strong spontaneous polarization and piezoelectric polarization, and thus is widely used in semiconductor structures such as high electron mobility transistors (HEMT) and the like.

In planar devices, current flows along the plane within the quantum well formed by the heterojunction structure. Under the condition of reverse bias, the electric field distribution of the device is usually not uniform. Generally, great electric field concentration occurs at the gate edge or drain edge, and the electric field at the gate edge or drain edge will rapidly increase with the reverse voltage, and when the field strength at the gate edge or drain edge reaches the critical breakdown field strength, the device is broken down.

A high breakdown voltage means that a device can operate in a wider voltage range, enabling higher power density and higher device reliability. Therefore, how to improve the breakdown voltage of the device is the focus of electronic device researchers.

SUMMARY

The purpose of the present disclosure is to provide semiconductor structures and manufacturing methods thereof.

To achieve the above object, one aspect of the present disclosure provides a semiconductor structure, including:

a base, where the base includes strip trenches arranged parallelly; and a heterojunction structure located on bottom walls and sidewalls of the strip trenches and on the base other than the strip trenches, where regions of the heterojunction structure located on the bottom walls and on the base other than the strip trenches are polarized regions, regions of the heterojunction structure on the sidewalls are non-polarized regions, and the polarized regions contain carriers; the heterojunction structure includes a source region and a drain region respectively located at both ends of each of the strip trenches, and a gate region between the source region and the drain region, and the carriers between the source region and the drain region are confined to flow in each of the polarized regions.

In some embodiments, the cross sections of the strip trenches are rectangular or trapezoidal.

In some embodiments, the cross sections of the strip trenches are V-shaped, inverted trapezoidal or bowl-shaped.

In some embodiments, the strip trenches are directly connected, enabling regions of the heterojunction structure located at junctions of the adjacent strip trenches are linearly distributed.

In some embodiments, the heterojunction structure does not fill up the strip trenches.

In some embodiments, the heterojunction structure includes from bottom to top: a channel layer and a barrier layer.

In some embodiments, the heterojunction structure includes from bottom to top: a back barrier layer and a channel layer.

In some embodiments, a gate insulating layer and a gate electrode are sequentially provided on the gate region, a source electrode is provided on the source region, and a drain electrode is provided on the drain region.

In some embodiments, the base is a semiconductor substrate.

In some embodiments, the base includes a semiconductor substrate, a nucleation layer and a buffer layer from bottom to up.

Another aspect of the present disclosure provides a manufacturing method for a semiconductor structure, including:

providing a base; forming strip trenches arranged parallelly in the base; and forming a heterojunction structure on bottom walls and sidewalls of the strip trenches and on the base other than the strip trenches, where regions of the heterojunction structure located on the bottom walls and on the base other than the strip trenches are polarized regions, regions of the heterojunction structure on the sidewalls are non-polarized regions, and the polarized regions contain carriers; the heterojunction structure includes a source region and a drain region respectively located at both ends of each of the strip trenches, and a gate region between the source region and the drain region, and the carriers between the source region and the drain region are confined to flow in each of the polarized regions.

In some embodiments, in the step of forming a heterojunction structure, the heterojunction structure does not fill up the strip trenches.

In some embodiments, in the step of forming a heterojunction structure, the heterojunction structure includes from bottom to top: a channel layer and a barrier layer.

In some embodiments, in the step of forming a heterojunction structure, the heterojunction structure includes from bottom to top: a back barrier layer and a channel layer.

In some embodiments, the manufacturing method further includes: forming a gate insulating layer and a gate electrode sequentially on the gate region; forming a source electrode on the source region; and forming a drain electrode on the drain region.

In some embodiments, the base is a semiconductor substrate, before forming the heterojunction structure, the manufacturing method further includes: forming a nucleation layer on the bottom walls and sidewalls of the strip trenches and on the semiconductor substrate other than the strip trenches.

In some embodiments, the base is a semiconductor substrate, before forming the heterojunction structure, the manufacturing method further includes: forming a nucleation layer and a buffer layer sequentially on the bottom walls and sidewalls of the strip trenches and on the semiconductor substrate other than the strip trenches.

In some embodiments, the base includes a semiconductor substrate, a nucleation layer and a buffer layer stacked from bottom to top.

BRIEF DESCRIPTION OF THE DRAWINGS

FIG. 9 is a cross-sectional structure schematic diagram of a semiconductor structure according to a third embodiment of the present disclosure;

FIG. 10 is a cross-sectional structure schematic diagram of a semiconductor structure according to a fourth embodiment of the present disclosure;

FIG. 11 is a cross-sectional structure schematic diagram of a semiconductor structure according to a fifth embodiment of the present disclosure;

Figure 1:
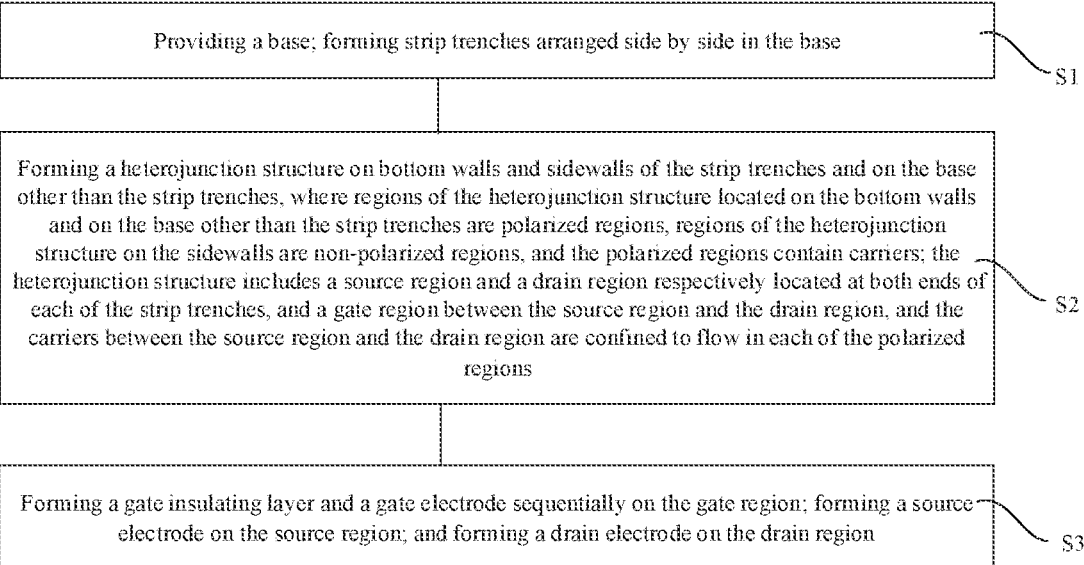
FIG. 1 is a flow diagram of a manufacturing method for a semiconductor structure according to a first embodiment of the present disclosure.

To facilitate understanding of the present disclosure, all reference numerals appearing in the present disclosure are listed below:

| | |
|---|---|
| base 10 | semiconductor substrate 102 |
| nucleation layer 103 | buffer layer 104 |

-continued

| | |
|---|---|
| strip trench 101 | heterojunction structure 11 |
| gate insulating layer 12 | source region 11a |
| drain region 11b | gate region 11c |
| channel layer 111 | barrier layer 112 |
| back barrier layer 113 | source electrode 13a |
| drain electrode 13b | gate electrode 13c |
| semiconductor structure 1, 2, | |
| 3, 4, 5, 6, 7, 8, 9, 20 | |

DETAILED DESCRIPTION OF THE EMBODIMENTS

To make the objects, features and advantages of the present disclosure more obvious and understandable, embodiments of the present disclosure will be described in detail below with reference to the accompanying drawings.

Figure 2:
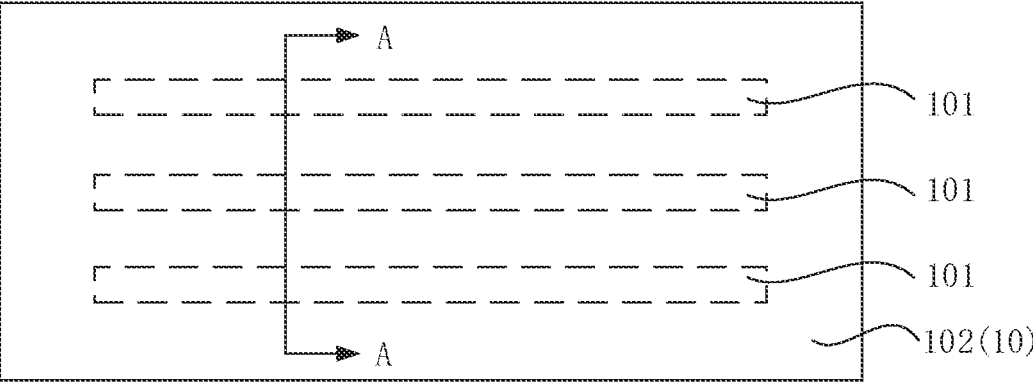
FIG. 2 is a top-view structure schematic diagram of the intermediate structure corresponding to the flow in FIG. 1.
Figure 3:
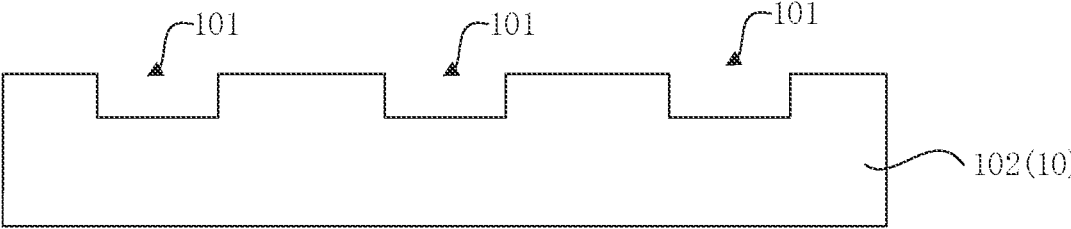
FIG. 3 is a sectional view along line A-A in FIG. 2.
Figure 4:
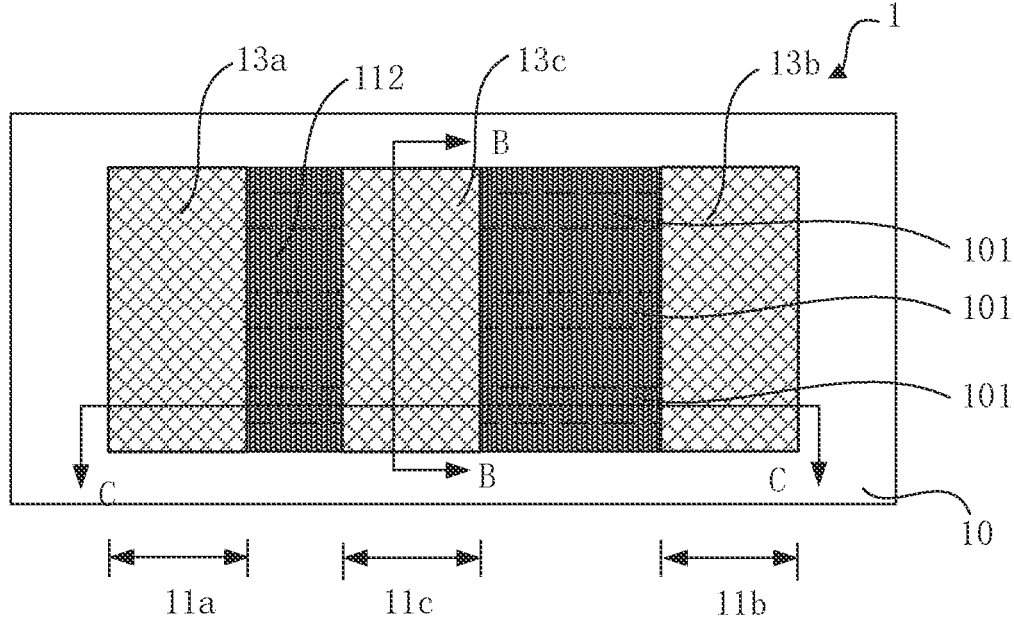
FIG. 4 is a top-view structure schematic diagram of the semiconductor structure according to the first embodiment of the present disclosure.
Figure 5:
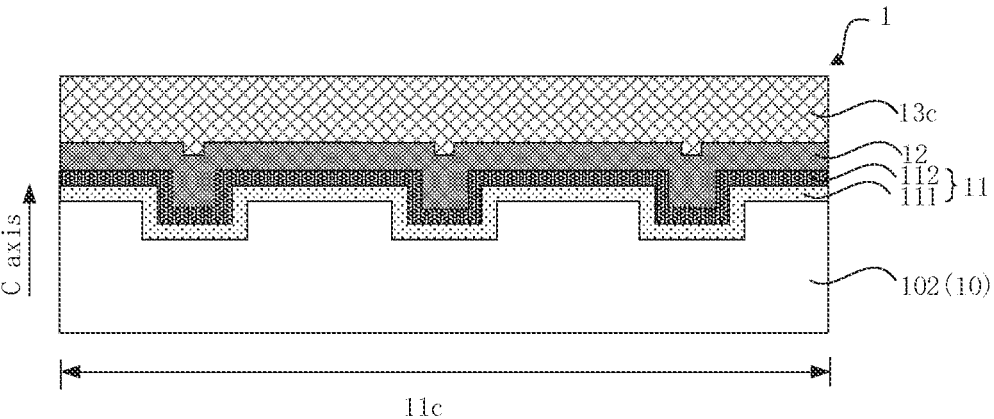
FIG. 5 is a sectional view along line B-B in FIG. 4.
Figure 6:
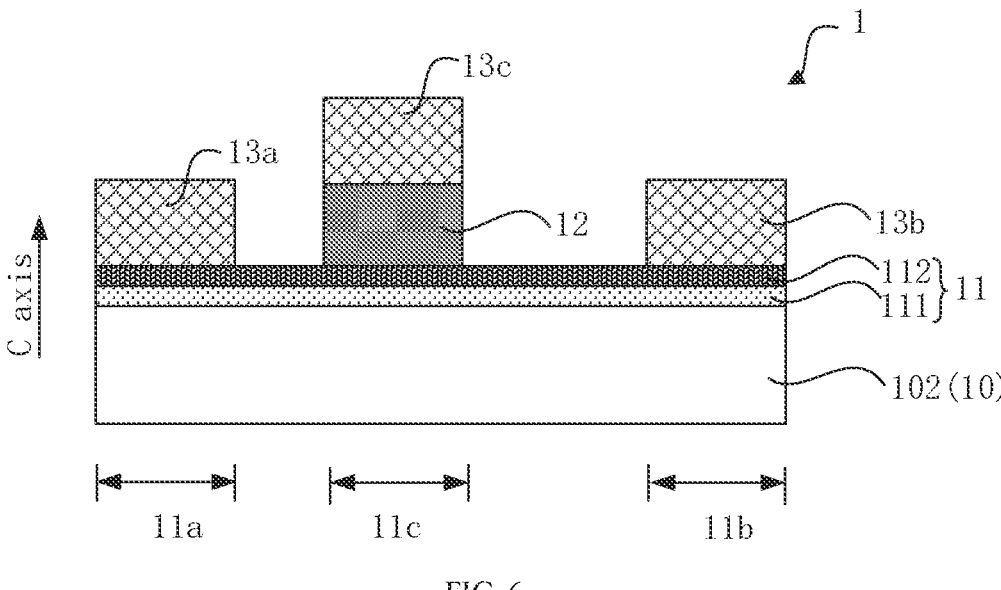
FIG. 6 is a sectional view along line C-C in FIG. 4.

FIG. 1 is a flow diagram of a manufacturing method for a semiconductor structure according to a first embodiment of the present disclosure. FIG. 2 is a top-view structure schematic diagram of the intermediate structure corresponding to the flow in FIG. 1. FIG. 3 is a sectional view along line A-A in FIG. 2. FIG. 4 is a top-view structure schematic diagram of the semiconductor structure according to the first embodiment of the present disclosure. FIG. 5 is a sectional view along line B-B in FIG. 4. FIG. 6 is a sectional view along line C-C in FIG. 4.

First, referring to step S1 in FIG. 1, as shown in FIG. 2 and FIG. 3, a base 10 is provided, and a plurality of strip trenches 101 arranged parallelly are formed in the base 10.

In this embodiment, the base 10 is a semiconductor substrate 102.

Semiconductor substrate 102 may include sapphire, silicon carbide, silicon, GaN or diamond.

It should be noted that, in the present disclosure, a certain material is represented by a chemical element, but the molar ratio of each chemical element in the material is not limited. For example, the GaN material contains Ga element and N element, but the molar ratio of Ga element and N element is not limited.

A plurality of strip trenches 101 refers to two or more strip trenches 101; the parallel arrangement of the plurality of strip trenches 101 means that the extending directions of the strip trenches 101 are parallel.

A cross section of a strip trench 101 may be rectangular. Correspondingly, the strip trenches 101 may be formed by dry etching or wet etching.

Next, referring to step S2 in FIG. 1 and as shown in FIGS. 4 to 6, a heterojunction structure 11 is formed on the bottom walls and sidewalls of the strip trenches 101 and on the base 10 other than the strip trenches 101. Regions of the heterojunction structure 11 at the bottom walls of the strip trenches 101 and on the base 10 other than the strip trenches 101 are polarized regions, and regions of the heterojunction structure 11 on the sidewalls of the strip trenches 101 are non-polarized regions. There are carriers in the polarized regions. The structure 11 includes a source region 11a and a drain region 11b respectively located at both ends of each strip trench 101, and a gate region 11c located between the source region 11a and the drain region 11b. The carriers between the source region 11a and the drain region 11b are confined to flow in the respective polarized region.

In this embodiment, the heterojunction structure 11 includes, from bottom to top, a channel layer 111 and a barrier layer 112. Two-dimensional electron gas or two-dimensional hole gas can be formed at an interface between the channel layer 111 and the barrier layer 112. Specifically, a) one channel layer 111 and one barrier layer 112 can be included; b) multiple channel layers 111 and multiple barrier layer 112 can be alternately distributed; or c) one channel layer 111 and two or more barrier layers 112 can be included to meet different functional requirements.

The channel layer 111 and/or the barrier layer 112 may include a group III nitride material. The material combination of the channel layer 111 and the barrier layer 112 may include: GaN/AlN, GaN/InN, GaN/InAlGaN, GaAs/AlGaAs, GaN/InAlN or InN/InAlN.

The forming process of the channel layer 111 and/or the barrier layer 112 may include: atomic layer deposition (ALD), chemical vapor deposition (CVD), molecular beam epitaxy (MBE), plasma enhanced chemical vapor deposition (PECVD), low pressure chemical vapor deposition (LPCVD), metal organic compound chemical vapor deposition (MOCVD), or a combination thereof.

For the grown heterojunction structure 11, the polarization axis (C axis) direction is parallel to the thickness direction of the base 10. Therefore, the plane direction of the heterojunction structure 11 located on the bottom walls of the strip trenches 101 and the base 10 other than the strip trenches 101 is perpendicular to the direction of the polarization axis (C axis), such that a polarization effect exists, which can generate carriers. Regions in which carries generated are polarized regions, and in the polarized regions, the interface between the channel layer 111 and the barrier layer 112 is a polar plane. The plane direction of the heterojunction structure 11 located on the sidewalls of the strip trenches 101 is parallel to the direction of the polarization axis (C axis), such that no polarity exists, and no carriers are generated. Regions in which no carriers is generated are non-polarized regions, and in the non-polarized regions, the interface between the channel layer 111 and the barrier layer 112 is a non-polar plane. In other words, in this embodiment, the strip trenches 101 are used to form alternately distributed polarized regions and non-polarized regions, and the non-polarized regions separate the polarized regions.

In this embodiment, neither the channel layer 111 nor the barrier layer 112 fills up the strip trenches 101.

Subsequently, referring to step S3 in FIG. 1 and as shown in FIGS. 4 to 6, the gate insulating layer 12 and the gate electrode 13c are sequentially formed on the gate region 11c, a source electrode 13a is formed on the source region 11a, and a drain electrode 13b is formed on the drain region 11b.

A material of the gate insulating layer 12 may include at least one of SiN, AlO, HfO, MgO, TiO, or GaO.

Specifically, the forming method for the gate insulating layer 12 may include:

First, an insulating material layer is formed on the entire surface by physical vapor deposition or chemical vapor deposition.

In this embodiment, the upper surface of the insulating material layer is not flat, that is, a thin insulating material layer is deposited on the entire surface of the heterojunction structure 11.

Later, the insulating material layer on the source region 11a and the drain region 11b are removed by dry etching or wet etching.

A forming method for the source electrode 13a, the drain electrode 13b and the gate electrode 13c may include:

First, a metal layer is formed by sputtering Ti/Al/Ni/Au, Ni/Au, etc.

Then, the metal layer in the regions other than the gate region 11c, the source region 11a and the drain region 11b are removed by etching;

Afterwards, high temperature annealing is performed, to form ohmic contact between the source electrode 13a and the source region 11a of the heterojunction structure 11 and between the drain electrode 13b and the drain region 11b of the heterojunction structure 11.

In an embodiment shown in FIG. 6, the source electrode 13a and the drain electrode 13b are in contact with the barrier layer 112, and ohmic contacts are formed both between the source electrode 13a and the barrier layer 112 and between the drain electrode 13b and the barrier layer 112.

In some embodiments, ohmic contacts can be formed between the source electrode 13a and the barrier layer 112 and between the drain electrode 13b and the barrier layer 112 by using N-type ion heavily doped layers. By the N-type ion heavily doped layer, ohmic contact layers between the source electrode 13a and the source region 11a of the heterojunction structure 11 and between the drain electrode 13b and the drain region 11b of the heterojunction structure 11 can be directly formed without high temperature annealing, thereby avoiding the degradation of the performance of the heterojunction structure 11 and the reduction of the electron mobility due to the high temperature during the annealing process.

In some embodiments, an N-type ion heavily doped layer may be provided on at least one of the source region 11a or the drain region 11b of the heterojunction structure 11. Between a source region 11a and a source electrode 13a of the heterojunction structure 11 without the N-type ion heavily doped layer, or between a drain region 11b and a drain electrode 13b of the heterojunction structure 11 without the N-type ion heavily doped layer, an ohmic contact layer may be formed by high temperature annealing.

In the N-type ion heavily doped layer, the N-type ions may include at least one of Si ions, Ge ions, Sn ions, Se ions or Te ions. For different N-type ions, the dopant concentration can be greater than $1E19/cm3$. The N-type ion heavily doped layer may include a group III nitride material, such as at least one of GaN, AlGaN, or AlInGaN.

As the polarized regions are separated by the non-polarized regions, the carriers between the source region 11a and the drain region 11b of the heterojunction structure 11 are restricted to flow in each of the polarized regions.

As shown in FIGS. 4 to 6, the semiconductor structure 1 of this embodiment includes:

a base 10, where the base 10 has strip trenches 101 arranged parallelly;

a heterojunction structure 11 located on the bottom walls and sidewalls of the strip trenches 101 and on the base 10 other than the strip trenches 101, where regions of the heterojunction structure 11 on the bottom walls of the strip trenches 101 and the base 10 other than the strip trenches 101 are polarized regions, regions of the heterojunction structure 11 on the sidewalls of the strip trenches 101 are non-polarized regions, and there are carriers in the polarized regions; the heterojunction structure 11 includes a source region 11a and a drain region 11b respectively located at both ends of each strip trench 101, and the gate region 11c located between the source region 11a and the drain region 11b; and the carriers between the source region 11a and the drain region 11b are limited to flow in each polarized region; and a gate insulating layer 12 and a gate electrode 13c on the gate region 11c, a source electrode 13a on the source region 11a, and a drain electrode 13b on the drain region 11b.

In this embodiment, the base 10 is a semiconductor substrate 102.

The material of the semiconductor substrate 102 may include sapphire, silicon carbide, silicon, GaN or diamond.

A plurality of strip trenches 101 refers to two or more strip trenches 101; the parallel arrangement of the plurality of strip trenches 101 means that the extending directions of the trenches 101 are parallel.

A cross section of a strip trench 101 may be rectangular.

In this embodiment, the heterojunction structure 11 includes, from bottom to top, a channel layer 111 and a barrier layer 112. Two-dimensional electron gas or two-dimensional hole gas can be formed at an interface between the channel layer 111 and the barrier layer 112. Specifically, a) one channel layer 111 and one barrier layer 112 can be included; b) multiple channel layers 111 and multiple barrier layer 112 can be alternately distributed; or c) one channel layer 111 and two or more barrier layers 112 can be included to meet different functional requirements.

The channel layer 111 and/or the barrier layer 112 may include a group III nitride material. The material combination of the channel layer 111 and the barrier layer 112 may include: GaN/AlN, GaN/InN, GaN/InAlGaN, GaAs/AlGaAs, GaN/InAlN or InN/InAlN.

A material of the gate insulating layer 12 may include at least one of SiN, AlO, HfO, MgO, TiO, or GaO.

The material of the source electrode 13a, the drain electrode 13b, and/or the gate electrode 13c may be metal, such as Ti/Al/Ni/Au, Ni/Au, and the like.

Understandably, the semiconductor structure 1 of this embodiment is a Metal/Insulator/Semiconductor (MIS) device. The MIS device can be a depletion-type device, that is, the MIS device has a normally-on state, and the conduction between the source electrode 13a and the drain electrode 13b is turned off only after a voltage is applied to the gate electrode 13c.

In the embodiment shown in FIG. 6, the source electrode 13a and the drain electrode 13b are in contact with the barrier layer 112, and ohmic contacts are formed both between the source electrode 13a and the barrier layer 112 and between the drain electrode 13b and the barrier layer 112.

In some embodiments, ohmic contacts can be formed between the source electrode 13a and the barrier layer 112 and between the drain electrode 13b and the barrier layer 112 by using N-type ion heavily doped layers. By the N-type ion heavily doped layers, ohmic contact layers between the source electrode 13a and the source region 11a of the heterojunction structure 11 and the drain electrode 13b and the drain region 11b of the heterojunction structure 11 can be directly formed without high temperature annealing, thereby avoiding the degradation of the performance of the heterojunction structure 11 and the reduction of the electron mobility due to the high temperature during the annealing process.

In some embodiments, an N-type ion heavily doped layer may be provided on at least one of the source region 11a or the drain region 11b of the heterojunction structure 11. Between a source region 11a and a source electrode 13a of the heterojunction structure 11 without the N-type ion heavily doped layer, or between a drain region 11b and a drain electrode 13b of the heterojunction structure 11 without the N-type ion heavily doped layer, an ohmic contact layer may be formed by high temperature annealing.

In the N-type ion heavily doped layer, the N-type ions may include at least one of Si ions, Ge ions, Sn ions, Se ions or Te ions. For different N-type ions, the dopant concentration can be greater than 1E19/cm3. The N-type ion heavily doped layer may be a group III nitride material, such as at least one of GaN, AlGaN, or AlInGaN.

In the semiconductor structure 1 of this embodiment, since the strip polarized regions are confined, the two-dimensional electron gas carriers or two-dimensional hole gas carriers at the interface between the channel layer 111 and the barrier layer 112 exhibit an approximately one-dimensional transport mode in the migration process, which can improve the carrier mobility. In addition, the control ability of the gate electrode 13c on the carriers can also be greatly improved, so the breakdown voltage of the device can be greatly improved and the electric leakage problem (including the electric leakage from the gate electrode 13c to the channel layer 111 and the electric leakage from channel layer 111 to the base 10) can be greatly alleviated, and the efficiency and linearity of the radio frequency device can be improved.

Figure 7:
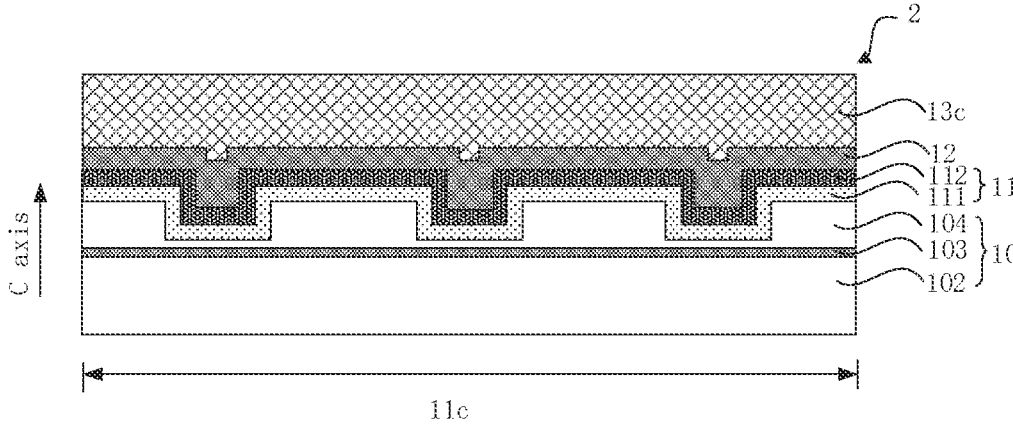
FIG. 7 is a cross-sectional structure schematic diagram of a semiconductor structure according to a second embodiment of the present disclosure.
Figure 8:
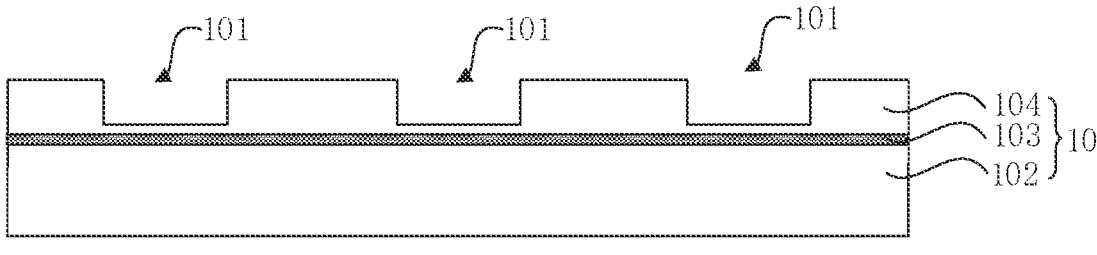
FIG. 8 is a cross-sectional structure schematic diagram of an intermediate structure corresponding to the semiconductor structure in FIG. 7.

FIG. 7 is a cross-sectional structure schematic diagram of a semiconductor structure according to a second embodiment of the present disclosure; FIG. 8 is a cross-sectional structure schematic diagram of an intermediate structure corresponding to the semiconductor structure in FIG. 7.

Referring to FIG. 7, a semiconductor structure 2 of the second embodiment is substantially the same as the semiconductor structure 1 of the first embodiment, except that the base 10 includes a semiconductor substrate 102, a nucleation layer 103 and a buffer layer 104 from bottom to top, strip trenches 101 are located in the buffer layer 104.

A material of the nucleation layer 103 may include, for example, AN, AlGaN, etc., and the material of the buffer layer 104 may include at least one of AlN, GaN, AlGaN, or AlInGaN. The nucleation layer 103 can alleviate the problem of lattice mismatch and thermal mismatch between the epitaxially grown semiconductor layer (such as the channel layer 111 in the heterojunction structure 11 as shown in FIG. 7) and the semiconductor substrate 102, and the buffer layer 104 can reduce the dislocation density and defect density of the epitaxially grown semiconductor layer, improving the crystal quality.

In some embodiments, the strip trenches 101 may also be in the buffer layer 104, the nucleation layer 103 and the semiconductor substrate 102.

Correspondingly, the manufacturing method of the semiconductor structure 2 of the second embodiment is substantially the same as the manufacturing method of the semiconductor structure 1 of the first embodiment, except that, referring to FIG. 8, in step S1, the provided base 10 includes the semiconductor substrate 102, the nucleation layer 103 and the buffer layer 104 from bottom to top, and strip trenches 101 arranged parallelly are formed in the buffer layer 104.

FIG. 9 is a cross-sectional structure schematic diagram of a semiconductor structure according to a third embodiment of the present disclosure.

Referring to FIG. 9, a semiconductor structure 3 of a third embodiment is substantially the same as the semiconductor structures 1 and 2 of the first and second embodiments, except that, the upper surface of the gate insulating layer 12 is flat.

Specifically, for the manufacturing method, in step S3, a thick insulating material layer may be deposited on the entire surface of the heterojunction structure 11 by physical vapor deposition or chemical vapor deposition, and then planarized by chemical mechanical polishing (CMP).

FIG. 10 is a cross-sectional structure schematic diagram of a semiconductor structure according to a fourth embodiment of the present disclosure.

Referring to FIG. 10, a semiconductor structure 4 of a fourth embodiment is substantially the same as the semiconductor structures 1, 2, and 3 of the first, second, and third embodiments, except that the upper surface of the barrier layer 112 is flat.

In this embodiment, the channel layer 111 does not fill up the strip trenches 101, the barrier layer 112 fills up the strip trenches 101, and the interface between the channel layer 111 and the barrier layer 112 has a partial plane parallel to the sidewalls of the strip trenches 102, thus the depolarized regions can be separated and confined.

FIG. 11 is a cross-sectional structure schematic diagram of a semiconductor structure according to a fifth embodiment of the present disclosure.

Referring to FIG. 11, a semiconductor structure 5 of this embodiment is substantially the same as the semiconductor structures 1, 2, 3, and 4 of the first, second, third, and fourth embodiments, except that the source electrode 13*a* and the drain electrode 13*b* are in contact with the channel layer 111, and ohmic contacts are formed between the source electrode 13*a* and the channel layer 111, and between the drain electrode 13*b* and the channel layer 111.

Correspondingly, the manufacturing method of a semiconductor structure 5 of a fifth embodiment is substantially the same as the manufacturing method of the semiconductor structures 1, 2, 3, and 4 of the first, second, third, and fourth embodiments, except that, in step S3, when forming the source electrode 13*a* on the source region 11*a* and the drain electrode 13*b* on the drain region 11*b* of the heterojunction structure 11, parts of the barrier layer 112 on the source region 11*a* and the drain region 11*b* is removed to expose the channel layer 111.

In some embodiments, ohmic contacts can also be formed between the source electrode 13*a* and the channel layer 111 and between the drain electrode 13*b* and the channel layer 111 by using N-type ion heavily doped layers. By the N-type ion heavily doped layer, ohmic contact layers between the source electrode 13*a* and the channel layer 111 and between the drain electrode 13*b* and the channel layer 111 can be directly formed without high temperature annealing.

In some embodiments, an ohmic contact is formed between the source electrode 13*a* and the channel layer 111, or between the drain electrode 13*b* and the channel layer 111, using an N-type ion heavily doped layer. Between the channel layer 111 and the source electrode 13*a* without the N-type ion heavily doped layer, or between the channel layer 111 and the drain electrode 13*b* without the N-type ion heavily doped layer, an ohmic contact layer may be formed by high temperature annealing.

Figure 12:
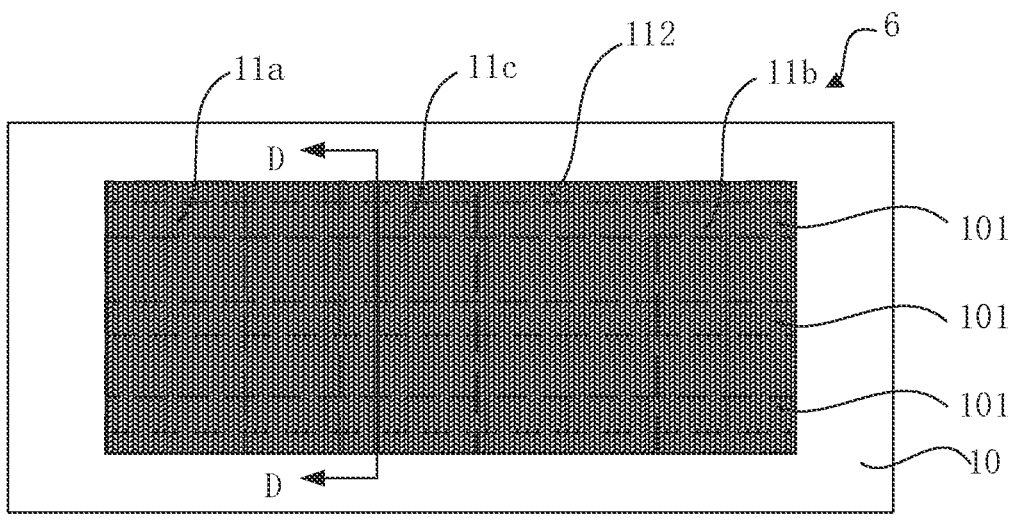
FIG. 12 is a top-view structure schematic diagram of a semiconductor structure according to a sixth embodiment of the present disclosure.
Figure 13:
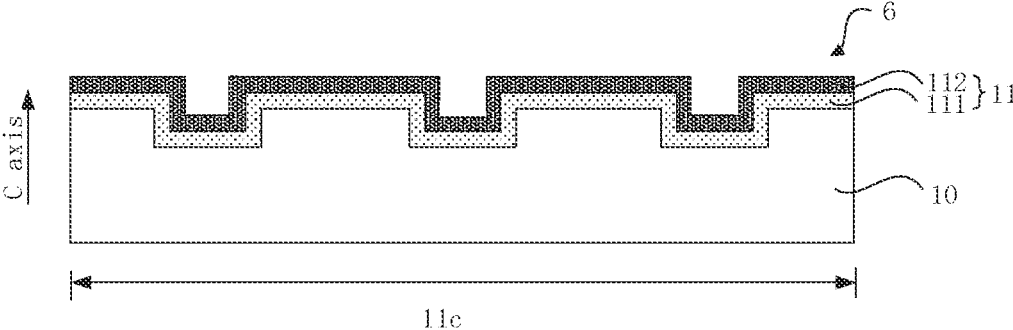
FIG. 13 is a sectional view along line D-D in FIG. 12.

FIG. 12 is a top-view structure schematic diagram of a semiconductor structure according to a sixth embodiment of the present disclosure; FIG. 13 is a sectional view along line D-D in FIG. 12.

Referring to FIGS. 12 and 13, a semiconductor structure 6 of a sixth embodiment is substantially the same as the semiconductor structures 1, 2, 3, 4, and 5 of the first to fifth embodiments, except that the semiconductor structure 6 is an intermediate semiconductor structure, where the gate insulating layer 12, the gate electrode 13*c*, the source electrode 13*a* and the drain electrode 13*b* are not manufactured.

Correspondingly, a manufacturing method of the semiconductor structure 6 of the sixth embodiment is substantially the same as the manufacturing method of the semiconductor structures 1, 2, 3, 4, and 5 of the first to fifth embodiments, except that step S3 is omitted.

In some embodiments, for the semiconductor structure 6 as an intermediate semiconductor structure, the gate insulating layer 12 is manufactured, and the gate electrode 13*c*, the source electrode 13*a* and the drain electrode 13*b* are not manufactured.

The semiconductor structure 6 can be produced and sold as a semi-finished product.

Figure 14:
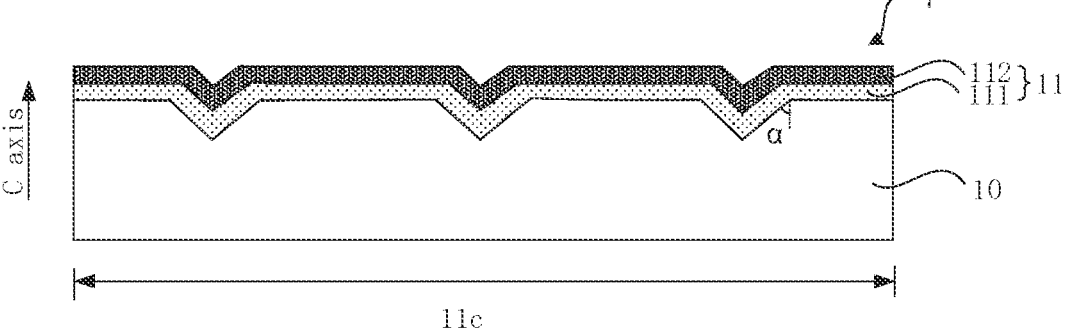
FIG. 14 is a cross-sectional structure schematic diagram of a semiconductor structure according to a seventh embodiment of the present disclosure.

FIG. 14 is a cross-sectional structure schematic diagram of a semiconductor structure according to a seventh embodiment of the present disclosure.

Referring to FIG. 14, a semiconductor structure 7 of a seventh embodiment and the manufacturing method thereof are substantially the same as the semiconductor structures 1, 2, 3, 4, 5, 6 and the manufacturing methods thereof in the first to sixth embodiments, except that a cross section of the strip trench 101 is V-shaped.

By controlling the size of the angle $\alpha$ between the slope and the vertical direction, the plane direction of the heterojunction structure 11 located on the sidewall of the slope is roughly parallel to the direction of the polarization axis (C axis), so there is basically no polarization effect and no carriers are generated, such that non-polarized regions can be formed.

In some embodiments, the cross section of the strip trench 101 may also be trapezoidal, inverted trapezoidal, or bowl-shaped.

Figure 15:
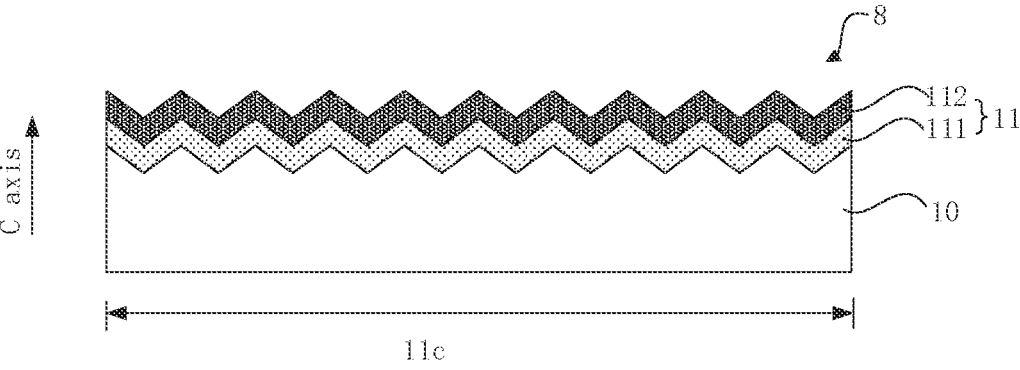
FIG. 15 is a cross-sectional structure schematic diagram of a semiconductor structure according to an eighth embodiment of the present disclosure.

FIG. 15 is a cross-sectional structure schematic diagram of a semiconductor structure according to an eighth embodiment of the present disclosure.

Referring to FIG. 15 and FIG. 14, a semiconductor structure 8 and a manufacturing method thereof of a eighth embodiment are substantially the same as the semiconductor structure 7 of the seventh embodiment and the manufacturing method thereof, except that the adjacent V-shaped strip trenches 101 are directly connected. In other words, regions of the heterojunction structure 11 located at the junctions of adjacent strip trenches 101 are distributed linearly.

In some embodiments, adjacent inverted trapezoidal or bowl-shaped strip trenches 101 may also be directly connected.

Linear distribution can further confine the strip polarized regions, and improve the mobility of two-dimensional electron gas carriers or two-dimensional hole gas carriers in the migration process of the heterojunction structure 11.

Figure 16:
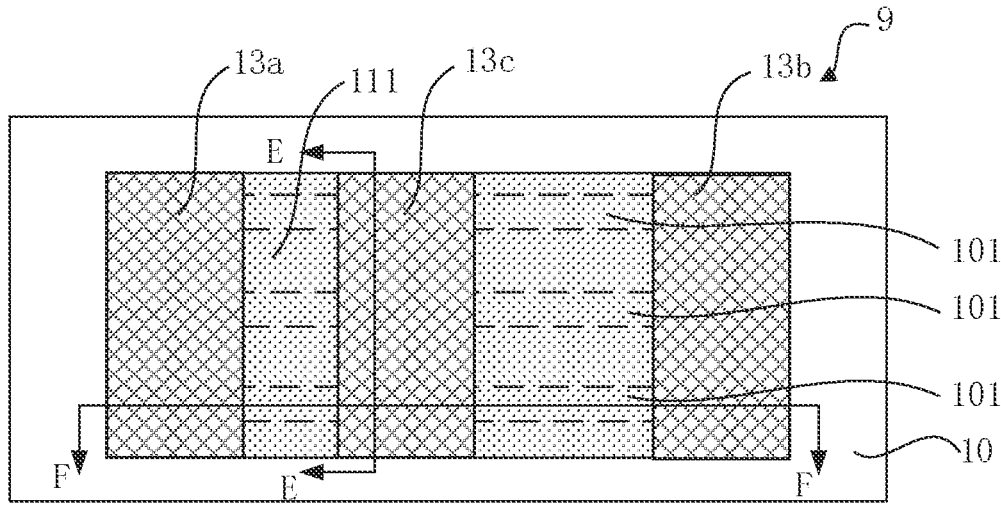
FIG. 16 is a top-view structure schematic diagram of a semiconductor structure according to a ninth embodiment of the present disclosure.
Figure 17:
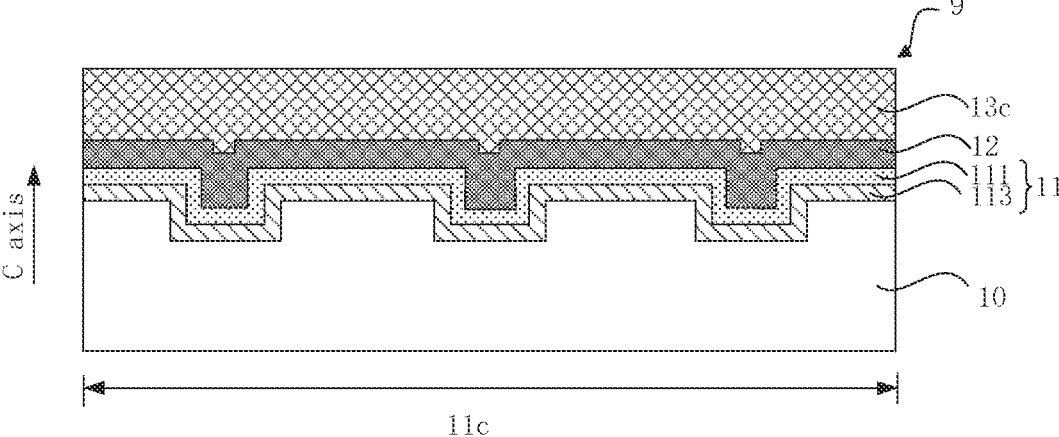
FIG. 17 is a sectional view along line E-E in FIG. 16.
Figure 18:
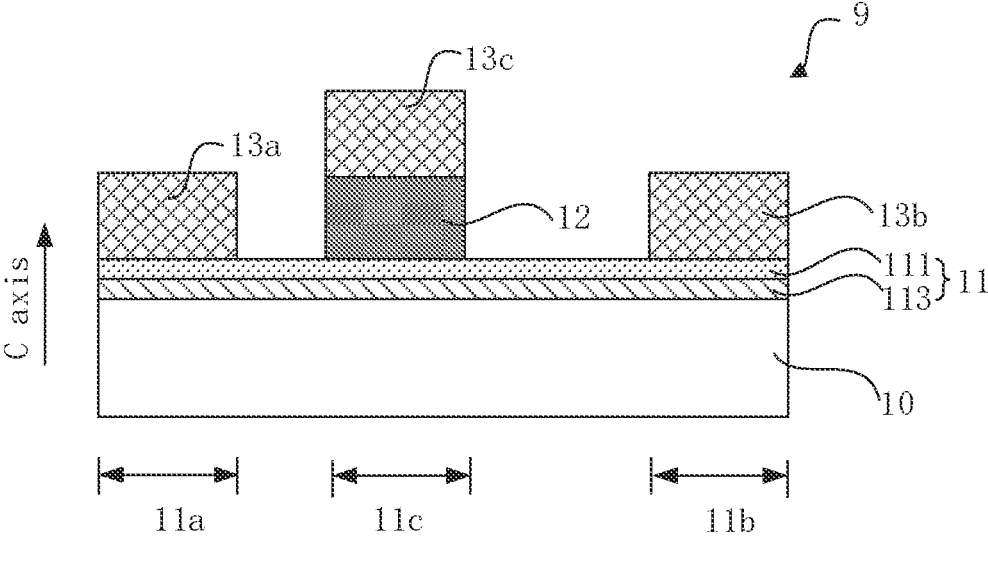
FIG. 18 is a sectional view along line F-F in FIG. 16.

FIG. 16 is a top-view structure schematic diagram of a semiconductor structure according to a ninth embodiment of the present disclosure; FIG. 17 is a sectional view along line E-E in FIG. 16; FIG. 18 is a sectional view along line F-F in FIG. 16.

Referring to FIGS. 16 to 18, a semiconductor structure 9 of a ninth embodiment and a manufacturing method thereof are roughly the same as the semiconductor structures 1, 2, 3, 4, 5, 6, 7, 8 and the manufacturing method thereof of the first to eighth embodiments. except that the heterojunction structure 11 includes a back barrier layer 113 and a channel layer 111 from bottom to top. Two-dimensional electron gas or two-dimensional hole gas may be formed at the interface between the back barrier layer 113 and the channel layer 111.

In an optional solution, the back barrier layer 113 is an AlGaN layer, and the channel layer 111 is an unintentionally doped GaN layer. Usually, due to the existence of defects such as nitrogen vacancies and oxygen doping, the unintentionally doped intrinsic GaN has a higher background electron concentration, so the GaN-based epitaxial material grown by MOCVD exhibits N-type conductivity.

In other optional solutions, the combination of the channel layer 111 and the back barrier layer 113 may also be GaN/AlN, GaN/InN, GaN/InAlGaN, GaAs/AlGaAs, GaN/InAlN or InN/InAlN. In addition, in addition to one channel layer 111 and one back barrier layer 113 being set as shown in FIG. 17; the heterojunction structure 11 may also include multiple channel layers 111 and back barrier layers 113 alternately distributed; or one channel layer 111 and two or more back barrier layers 113 can be set, to form a multi-barrier structure.

In this embodiment, neither the channel layer 111 nor the back barrier layer 113 fills up the strip trenches 101. In some embodiments, the back barrier layer 113 may not fill up the strip trenches 101, and the channel layer 111 may fill up the strip trenches 101. In other words, at least a portion of the interface between the hetero-materials of the heterojunction structure 11 is parallel to the sidewalls of the strip trenches, so long as the depolarized regions can be separated.

In an embodiment shown in FIG. 18, the source electrode 13a and the drain electrode 13b are in contact with the channel layer 111, and ohmic contacts are formed both between the source electrode 13a and the channel layer 111 and between the drain electrode 13b and the channel layer 111.

In some embodiments, ohmic contacts can be formed between the source electrode 13a and the channel layer 111 and between the drain electrode 13b and the channel layer 111 by using N-type ion heavily doped layers. the N-type ion heavily doped layer, ohmic contact layers between the source electrode 13a and the source region 11a of the heterojunction structure 11 and between the drain electrode 13b and the drain region 11b of the heterojunction structure 11 can be directly formed without high temperature annealing, avoiding the degradation of the performance of the heterojunction structure 11 and the reduction of the electron mobility due to the high temperature during the annealing process.

In some embodiments, an N-type ion heavily doped layer may be set on at least one of the source region 11a or the drain region 11b of the heterojunction structure 11. Between a source region 11a and a source electrode 13a of the heterojunction structure 11 without the N-type ion heavily doped layer, or between a drain region 11b and a drain electrode 13b of the heterojunction structure 11 without the N-type ion heavily doped layer, an ohmic contact layer may be formed by high temperature annealing.

In the N-type ion heavily doped layer, the N-type ions may be at least one of Si ions, Ge ions, Sn ions, Se ions or Te ions. For different N-type ions, the dopant concentration can be greater than 1E19/cm3. The N-type ion heavily doped layer may be a group III nitride material, such as at least one of GaN, AlGaN, or AllnGaN.

In some embodiments, the source electrode 13a and the drain electrode 13b can also contact with the back barrier layer 113, ohmic contacts are formed between the source electrode 13a and the back barrier layer 113 and between the drain electrode 13b and the back barrier layer 113.

Correspondingly, for the manufacturing method: in step S3, when forming the source electrode 13a on the source region 11a and the drain electrode 13b on the drain region 11b, the channel layer 111 on the source region 11a and the drain region 11b can be removed to expose the back barrier layer 113.

In some embodiments, ohmic contacts can also be formed between the source electrode 13a and the back barrier layer 113 and between the drain electrodes 13b and the back barrier layer 113 by using N-type ion heavily doped layers.

By the N-type ion heavily doped layer, ohmic contact layers between the source electrode 13a and the back barrier layer 113 and between the drain electrode 13b and the back barrier layer 113 can be directly formed without high temperature annealing.

In some embodiments, an ohmic contact is formed between the source electrode 13a and the back barrier layer 113 or between the drain electrode 13b and the back barrier layer 113 by using an N-type ion heavily doped layer. Between the back barrier layer 113 and the source electrode 13a without the N-type ion doped layer, or between the back barrier layer 113 and the drain electrode 13b without the N-type ion doped layer, an ohmic contact layer may be formed by high temperature annealing.

Figure 19:
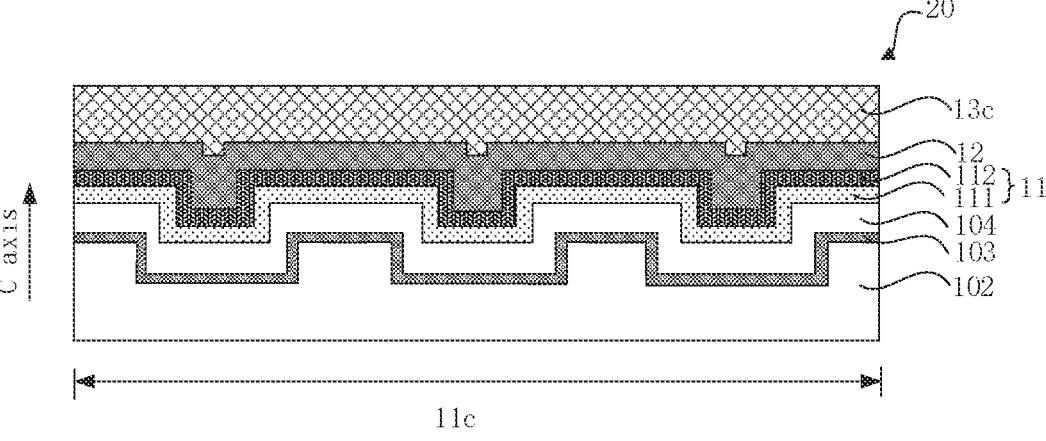
FIG. 19 is a cross-sectional structure schematic diagram of a semiconductor structure according to a tenth embodiment of the present disclosure.

FIG. 19 is a cross-sectional structure schematic diagram of a semiconductor structure according to a tenth embodiment of the present disclosure.

Referring to FIG. 19, a semiconductor structure 20 of a tenth embodiment is substantially the same as the semiconductor structures 1, 2, 3, 4, 5, 6, 7, 8, and 9 of the first to ninth embodiments, except that the base 10 is a semiconductor substrate 102. A nucleation layer 103 and a buffer layer 104 are formed from bottom to top between the heterojunction structure 11 and the bottom walls and sidewalls of the strip trenches 101 and the semiconductor substrate 102 other than the strip trenches 101.

Correspondingly, a manufacturing method of the semiconductor structure 20 of the tenth embodiment is substantially the same as the manufacturing method of the semiconductor structures 1, 2, 3, 4, 5, 6, 7, 8, and 9 of the first to ninth embodiments, except that, in the step S2, a nucleation layer 103, a buffer layer 104 and a heterojunction structure 11 are sequentially formed on the bottom walls and sidewalls of the strip trenches 101 and the semiconductor substrate 102 other than the strip trenches 101.

In some embodiments, there may only be a nucleation layer 103 between the heterojunction structure 11 and the bottom walls and sidewalls of the strip trenches 101 and the semiconductor substrate 102 other than the strip trenches 101. Correspondingly, in step S2, the nucleation layer 103 and the heterojunction structure 11 are sequentially formed on the bottom walls and sidewalls of the strip trenches 101 and the semiconductor substrate 102 other than the strip trenches 101.

Although the present disclosure is disclosed above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A semiconductor structure, comprising:
a base, wherein the base comprises strip trenches arranged parallelly; and
a heterojunction structure located on bottom walls and sidewalls of the strip trenches and on the base other than the strip trenches, wherein regions of the heterojunction structure located on the bottom walls and on the base other than the strip trenches are polarized regions, regions of the heterojunction structure on the sidewalls are non-polarized regions, and the polarized regions contain carriers; the heterojunction structure comprises a source region and a drain region respectively located at both ends of each of the strip trenches along a length direction, and a gate region between the source region and the drain region; and the carriers between the source region and the drain region are confined to flow in each of the polarized regions.

2. The semiconductor structure according to claim 1, wherein, cross sections of the strip trenches are rectangular or trapezoidal.

3. The semiconductor structure according to claim 1, wherein cross sections of the strip trenches are V-shaped, inverted trapezoidal or bowl-shaped.

4. The semiconductor structure according to claim 3, wherein the strip trenches are directly connected, enabling regions of the heterojunction structure located at junctions of the strip trenches that are adjacent to each other to be linearly distributed.

5. The semiconductor structure according to claim 1, wherein the heterojunction structure does not fill up the strip trenches.

6. The semiconductor structure according to claim 1, wherein the heterojunction structure comprises from bottom to top:

a channel layer and a barrier layer, or a back barrier layer and a channel layer.

7. The semiconductor structure according to claim 1, further comprising:

a gate insulating layer and a gate electrode sequentially provided on the gate region;

a source electrode provided on the source region; and a drain electrode provided on the drain region.

8. The semiconductor structure according to claim 1, wherein the base is a semiconductor substrate; or the base comprises a semiconductor substrate, a nucleation layer and a buffer layer from bottom to up.

\* \* \* \* \*